(12) United States Patent
Uetani et al.

(10) Patent No.: US 10,790,437 B2
(45) Date of Patent: Sep. 29, 2020

(54) PIEZOELECTRIC ELEMENT

(71) Applicant: NGK INSULATORS, LTD., Nagoya-Shi (JP)

(72) Inventors: Masayuki Uetani, Nagoya (JP); Tomohiko Hibino, Nagoya (JP); Akifumi Morishita, Nagoya (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 730 days.

(21) Appl. No.: 15/472,615

(22) Filed: Mar. 29, 2017

(65) Prior Publication Data

US 2017/0288129 A1 Oct. 5, 2017

(30) Foreign Application Priority Data

Mar. 30, 2016 (JP) .................. 2016-069146

(51) Int. Cl.
*H01L 41/187* (2006.01)
*B32B 18/00* (2006.01)
(Continued)

(52) U.S. Cl.
CPC .......... *H01L 41/1876* (2013.01); *B32B 18/00* (2013.01); *C04B 35/491* (2013.01);
(Continued)

(58) Field of Classification Search
CPC . H01L 41/1876; H01L 41/0471; H01L 41/09; H01L 41/113; B32B 18/00; C04B 35/491; C04B 2235/3217; C04B 2235/3234; C04B 2235/3244; C04B 2235/3249; C04B 2235/3251; C04B 2235/3262; C04B 2235/3279; C04B 2235/3281; C04B 2235/3284; C04B 2235/3296; C04B 2235/3418; C04B 2235/5445; C04B 2235/6025; C04B 2235/75; C04B 2235/80; C04B 2235/85; C04B 2235/96; C04B 2235/346; C04B 2235/68
(Continued)

(56) References Cited

U.S. PATENT DOCUMENTS 6,142,615 A 11/2000 Qiu et al.
2005/0275696 A1* 12/2005 Miyazawa ........... B41J 2/14233
347/72
(Continued)

FOREIGN PATENT DOCUMENTS

JP H11-129478 A 5/1999
JP 2000-211968 A 8/2000
JP 2014-195000 A1 10/2014

*Primary Examiner* — Thomas M Dougherty
(74) *Attorney, Agent, or Firm* — Burr & Brown, PLLC

(57) ABSTRACT

A piezoelectric element includes a piezoelectric body having a main phase configured by lead zirconate titanate and a heterogenous phase configured by a different component to lead zirconate titanate, and a pair of electrodes provided on the piezoelectric body. The piezoelectric body has a surface region within 10 μm of a surface, and an inner region more than 10 μm from the surface. A surface area coverage of the heterogenous phase in a cross section of the surface region is at least 0.75% greater than a surface area coverage of the heterogenous phase in a cross section of the inner region.

6 Claims, 6 Drawing Sheets

(51) Int. Cl.
*C04B 35/491* (2006.01)
*H01L 41/047* (2006.01)
*H01L 41/09* (2006.01)
*H01L 41/113* (2006.01)

(52) U.S. Cl.
CPC .. *H01L 41/0471* (2013.01); *C04B 2235/3217* (2013.01); *C04B 2235/3234* (2013.01); *C04B 2235/3244* (2013.01); *C04B 2235/3249* (2013.01); *C04B 2235/3251* (2013.01); *C04B 2235/3262* (2013.01); *C04B 2235/3279* (2013.01); *C04B 2235/3281* (2013.01); *C04B 2235/3284* (2013.01); *C04B 2235/3296* (2013.01); *C04B 2235/3418* (2013.01); *C04B 2235/5445* (2013.01); *C04B 2235/6025* (2013.01); *C04B 2235/75* (2013.01); *C04B 2235/80* (2013.01); *C04B 2235/85* (2013.01); *C04B 2235/96* (2013.01); *C04B 2237/346* (2013.01); *C04B 2237/68* (2013.01); *H01L 41/09* (2013.01); *H01L 41/113* (2013.01)

(58) Field of Classification Search
USPC ....... 310/358; 501/134; 262/62.9 PZ, 62.9 R
See application file for complete search history.

(56) References Cited

U.S. PATENT DOCUMENTS

| | | | |
|---|---|---|---|
| 2008/0218560 A1* | 9/2008 | Noguchi | B41J 2/14233 347/71 |
| 2014/0004379 A1* | 1/2014 | Eguchi | H01L 28/55 428/661 |
| 2014/0292158 A1 | 10/2014 | Masuda et al. | |
| 2015/0054387 A1* | 2/2015 | Li | H01L 41/0471 310/363 |

\* cited by examiner

BACKSCATTERED ELECTRON IMAGE

SECONDARY ELECTRON IMAGE

BINARIZED SEM IMAGE

PIEZOELECTRIC ELEMENT

BACKGROUND OF THE INVENTION

1. Field of the Invention

The present invention relates to a piezoelectric element.

2. Description of Related Art

A typical piezoelectric element is known that comprises a piezoelectric body configured from a piezoelectric ceramic material and a pair of electrodes provided on the piezoelectric body. The piezoelectric element is used in an actuator, ink jet head, speaker, buzzer and resonator by use of an inverse piezoelectric effect caused by deformation of the piezoelectric body by application of a voltage, or in a gyrosensor and shock sensor by use of a piezoelectric effect in which a force applied to the piezoelectric body is converted into a voltage.

Lead zirconate titanate (PZT) that satisfies both of a high electromechanical coupling factor and a high piezoelectric constant is suitable as the piezoelectric ceramic material that configures the piezoelectric body (reference for example is made to Japanese Patent Application Laid-Open No. 2014-195000).

SUMMARY OF THE INVENTION

Technical Problem

However, when a mechanical load is applied to the piezoelectric body, a crack may be formed on the surface of the piezoelectric body. In that context, it has been proposed to enhance the mechanical strength of the piezoelectric body by inhibiting particle growth of the PZT particles and thereby reduce the particle diameter.

However, there is the problem that the displacement characteristics of the piezoelectric body are reduced when the particle diameter of the PZT particles is reduced.

The present invention is proposed based on the new insight above, and has the object of providing a piezoelectric element that enables inhibition of surface cracks and inhibits a reduction in displacement characteristics.

The piezoelectric element according to the present invention comprises a piezoelectric body having a main phase configured by lead zirconate titanate and a heterogenous phase configured by a different component to lead zirconate titanate, and a pair of electrodes provided on the piezoelectric body. The piezoelectric body has a surface region within 10 μm of a surface, and an inner region more than 10 μm from the surface. A surface area coverage of the heterogenous phase in a cross section of the surface region is at least 0.75% greater than a surface area coverage of the heterogenous phase in a cross section of the inner region.

Effect of Invention

According to the present invention, it is possible to provide a piezoelectric element that enables inhibition of cracks produced on the surface.

DETAILED DESCRIPTION OF THE INVENTION

Configuration of Piezoelectric Element 1
(1) Overview

Figure 1:
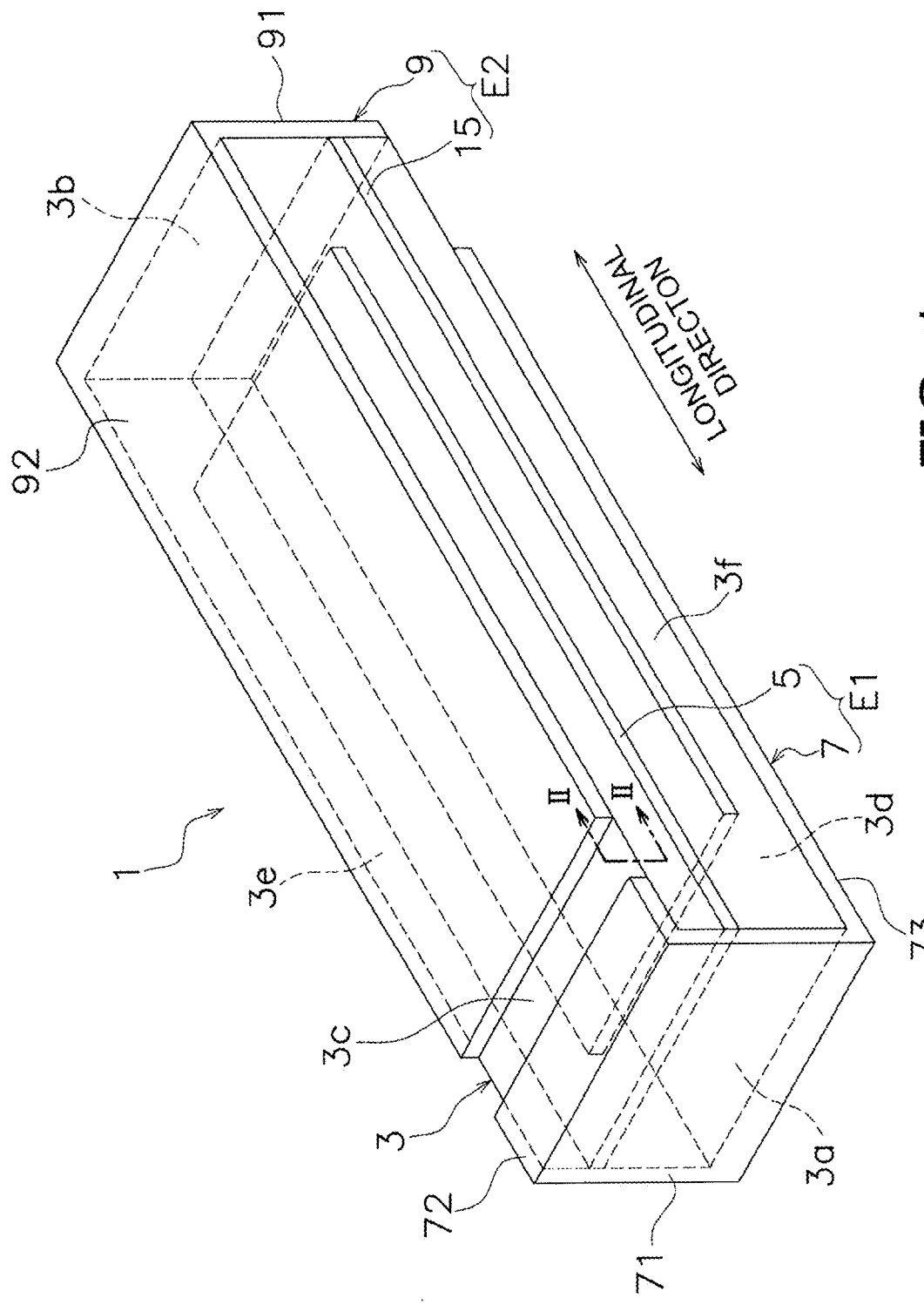
FIG. 1 is a perspective view illustrating a configuration of a piezoelectric element.

FIG. 1 is a perspective view illustrating a configuration of a piezoelectric element 1 according to the present embodiment. The piezoelectric element 1 comprises a piezoelectric body 3, and a first electrode E1 and a second electrode E2. The first electrode E1 comprises a first inner electrode 5 and a first outer electrode 7. The second electrode E2 comprises a second inner electrode 15 and a second outer electrode 9. The piezoelectric element 1 for example finds suitable application as an actuator for driving a head slider provided on a head suspension of a hard disk device (HDD).

(2) Piezoelectric Body 3

The piezoelectric body 3 is formed in a substantially solid rectangular shape that extends in a longitudinal direction. The piezoelectric body 3 comprises a pair of end surfaces 3a, 3b and a pair of first side surfaces 3c, 3d and a pair of second side surfaces 3e, 3f. The pair of end surfaces 3a, 3b, the pair of first side surfaces 3c, 3d and the pair of second side surfaces 3e, 3f form the surfaces of the piezoelectric body 3. The pair of end surfaces 3a, 3b is vertical relative to the longitudinal direction, and is mutually opposed. The pair of first side surfaces 3c, 3d extends parallel to the longitudinal direction, and is mutually opposed. The pair of second side surfaces 3e, 3f is orthogonal to the pair of first side surfaces 3c, 3d.

The piezoelectric body 3 is configured by a piezoelectric ceramic material. The piezoelectric body 3 contains lead zirconate titanate (PZT:Pb(Zr,Ti)$O_3$) as a main phase (main component). The piezoelectric body 3 contains a component that is different from PZT as a heterogenous phase (heterogenous component). The material that configures the heterogenous phase includes zirconia ($ZrO_2$), alumina ($Al_2O_3$), silica ($SiO_2$), nickel oxide (NiO), niobium oxide ($Nb_2O_5$), lead oxide (PbO), zinc oxide (ZnO), copper oxide (CuO), manganese oxide (MnO), and a mixture of a combination of two or more of these substances. The piezoelectric body 3 may contain a secondary component of alumina ($Al_2O_3$), silica ($SiO_2$), nickel oxide (NiO), niobium oxide ($Nb_2O_5$), lead oxide (PbO), zinc oxide (ZnO), copper oxide (CuO), and manganese oxide (MnO). The microstructure of the piezoelectric body 3 will be described below.

(3) First Electrode E1

The first inner electrode 5 is embedded in the piezoelectric body 3. The first inner electrode 5 is formed parallel to the pair of first side surfaces 3c, 3d. The first inner electrode 5 is formed in a tabular shape. The first inner electrode 5 is exposed on the end surface 3a, and not exposed on the end surface 3b. The first inner electrode 5 is respectively exposed on the pair of second side surfaces 3e, 3f. The first inner electrode 5 may be configured for example by Pt.

There is no particular limitation on the thickness of the first inner electrode 5 and it may be configured for example as 0.5 μm to 3.0 μm.

The first outer electrode 7 comprises a first electrode portion 71, a second electrode portion 72 and a third electrode portion 73. The first electrode portion 71 is disposed on the end surface 3a. The first electrode portion 71 substantially covers the entire portion of the end surface 3a. The second electrode portion 72 is disposed on the first side surface 3c. The second electrode portion 72 covers the first end of the first side surface 3c. The third electrode portion 73 is disposed on the first side surface 3d. The third electrode portion 73 covers at least half of the first side surface 3d. The third electrode portion 73 is opposite the second inner electrode 15. The first electrode portion 71, the second electrode portion 72 and the third electrode portion 73 are integrally formed. The first electrode portion 71 is connected to the first inner electrode 5 that is exposed on the end surface 3a. The first electrode portion 71, the second electrode portion 72 and the third electrode portion 73 for example may be configured by Pt. There is no particular limitation in relation to the respective thicknesses of the first electrode portion 71, the second electrode portion 72 and the third electrode portion 73 and it may be configured for example as 0.5 μm to 3.0 μm.

(4) Second Electrode E2

The second inner electrode 15 is embedded in the piezoelectric body 3. The second inner electrode 15 is formed parallel to the pair of first side surfaces 3c, 3d. The second inner electrode 15 is disposed between the first inner electrode 5 and the third electrode portion 73. The second inner electrode 15 is formed in a tabular shape. The second inner electrode 15 is exposed on the end surface 3b, and not exposed on the end surface 3a. The second inner electrode 15 is respectively exposed on the pair of second side surfaces 3e, 3f. The second inner electrode 15 may be configured for example by Pt. There is no particular limitation on the thickness of the second inner electrode 15 and it may be configured for example as 0.5 μm to 3.0 μm.

The second outer electrode 9 comprises a first electrode portion 91 and a second electrode portion 92. The first electrode portion 91 is disposed on the end surface 3b. The first electrode portion 91 substantially covers the entire portion of the end surface 3b. The second electrode portion 92 is disposed on the first side surface 3c. The second electrode portion 92 covers at least half of the first side surface 3c. The second electrode portion 92 is opposed to the first inner electrode 5. The first electrode portion 91 and the second electrode portion 92 are integrally formed. The first electrode portion 91 is connected to the second inner electrode 15 that is exposed on the end surface 3b. The first electrode portion 91 and the second electrode portion 92 for example may be configured by Pt. There is no particular limitation in relation to the respective thicknesses of the first electrode portion 91 and the second electrode portion 92 and it may be configured for example as 0.5 μm to 3.0 μm.

In the piezoelectric element 1, the first inner electrode 5 and the first outer electrode 7 function as the first electrode E1 for application of an electrical field to the piezoelectric body 3, and the second inner electrode 15 and the second outer electrode 9 function as the second electrode E2 for application of an electrical field to the piezoelectric body 3. In the piezoelectric body 3, the region sandwiched by the second electrode portion 92 and the first inner electrode 5, the region sandwiched by the first inner electrode 5 and the second inner electrode 15, and the region sandwiched by the second inner electrode 15 and the third electrode portion 73 are active regions that displace in response to an applied electrical field.

Microstructure of Piezoelectric Body 3

1. Surface Region 31 and Inner Region 32

Figure 2:
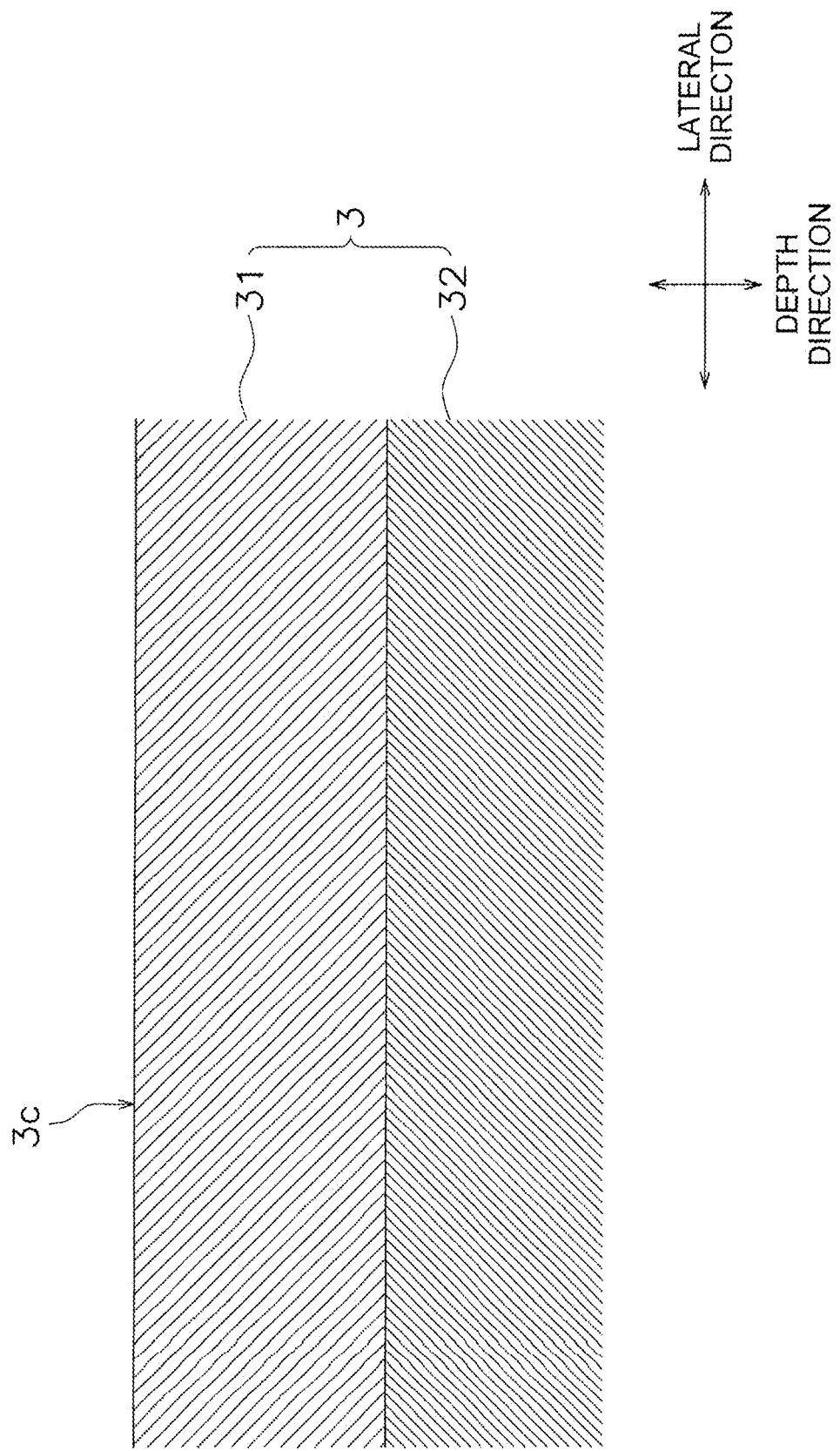
FIG. 2 is a cross-sectional view along II-II in FIG. 1.

FIG. 2 is a cross-sectional view along II-II in FIG. 1. The piezoelectric body 3 has a surface region 31 and an inner region 32.

The surface region 31 is a region within 10 μm of the first side surface 3c of the piezoelectric body 3. The surface region 31 is formed on the inner region 32. The surface region 31 is formed as a layer. The inner region 32 is a region more than 10 μm from the first side surface 3c of the piezoelectric body 3. The inner region 32 is disposed on an inner side of the surface region 31.

2. Surface Area Coverage R of Heterogenous Phase

The respective surface region 31 and inner region 32 contain PZT as a main phase. The content ratio of PZT in the surface region 31 may be configured as at least 96 vol %. The content ratio of PZT in the inner region 32 may be configured as at least 97 vol %. The surface region 31 contains a component other than PZT as a heterogenous phase. The inner region 32 may contain a heterogenous phase or may not contain a heterogenous phase.

In the present embodiment, the surface area coverage R1 of the heterogenous phase in a cross section of the surface region 31 is at least 0.75% greater than the surface area coverage R2 of the heterogenous phase in the cross section of the inner region 32. In this manner, during firing of the piezoelectric body 3, the average particle diameter of the PZT particles that configure the surface region 31 can be reduced since it is possible to inhibit particle growth of the PZT particles that configure the surface region 31 due to the presence of the heterogenous phase. As a result, the mechanical strength of the surface of the piezoelectric body 3 can be enhanced, and therefore it is possible to inhibit the production of cracks in the surface of the piezoelectric body 3. Furthermore, during firing of the piezoelectric body 3, since particle growth of the PZT particles that configure the inner region 32 tends not to be impeded by the presence of the heterogenous phase, the average particle diameter of the PZT particles that configure the inner region 32 increases and therefore a reduction in displacement characteristics can be suppressed.

The method of calculating the surface area coverage R1 of the heterogenous phase in the surface region 31 and the surface area coverage R2 of the heterogenous phase in the inner region 32 will now be described. Since the method of calculating the surface area coverage R1 and the surface area coverage R2 is the same, the method of calculating the surface area coverage R1 will be described below.

Figure 3:
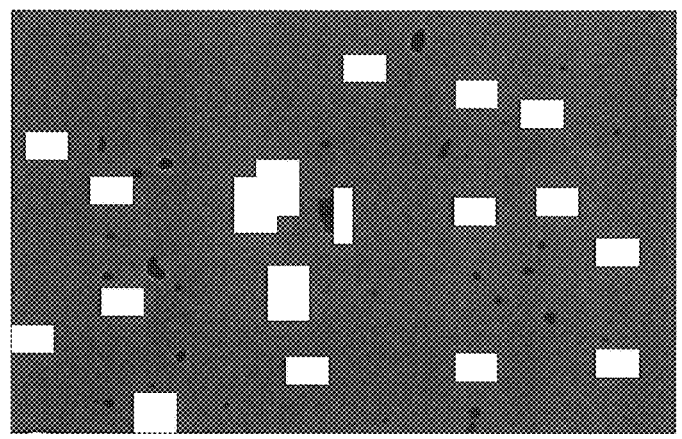
FIG. 3 is an example of a backscattered electron image of the surface region cross section.
Figure 4:
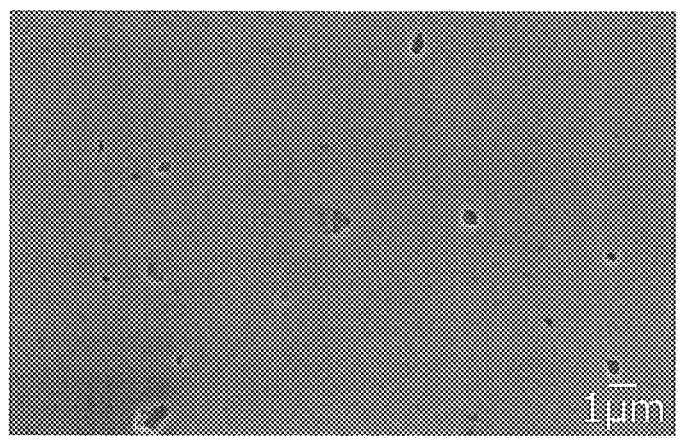
FIG. 4 is an example of a secondary electron image of the surface region cross section.

Firstly, an SEM (Scanning Electron Microscope) that includes a backscattered electron detector is used to acquire a backscattered electron image and a secondary electron image of a cross section of the surface region 31. The observed range is a rectangular region in a depth direction of 10 μm×a lateral direction of 20 μm. The acceleration velocity of the SEM is 10.0 kV, and the observed magnification is ×5000. When acquiring the backscattered electron image, the brightness and contrast can be adjusted so that the heterogenous phase has a darkened display. In addition, when the backscattered electron image and the secondary electron image are compared, the pores on the backscattered electron image are displayed in a white color. FIG. 3 is an example of a backscattered electron image after coloring the pores in a cross section of the surface region 31 in a white color. FIG. 4 is an example of a secondary electron image of a cross section of the surface region 31.

Figure 5:
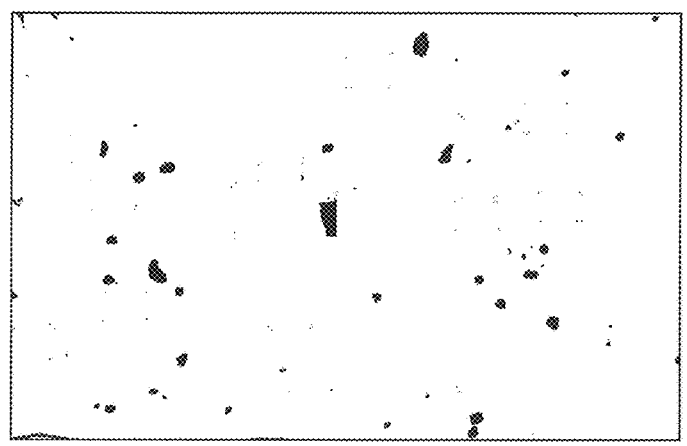
FIG. 5 is an example of a binarized backscattered electron image.

Then, image processing software PickMap (URL: http://fishers.dtdns.net/software/pickmap/index.html#1) is used to binarize the backscattered electron image into white and black by use of the average value of RGB as a threshold value to thereby match with the SEM image. FIG. 5 is an example of a binarized backscattered electron image. In FIG. 5, the heterogenous phase is displayed black and portions other than the heterogenous phase are displayed white. The surface area coverage of the heterogenous phase in the observation range is acquired based on the total surface area of the heterogenous phase calculated using the image processing software PickMap.

The surface area coverage that is acquired in the manner described above is acquired at five positions in the cross section of the surface region 31, and the arithmetic average of the five surface area coverages is taken to be the "surface area coverage R1". The five positions for measurement of the surface area coverage are the five cross sections resulting from equal division into six portions of the surface region 31 in a longitudinal direction.

The surface area coverage R1 of the heterogenous phase in the cross section of the surface region 31 is preferably at least 1.6%, and more preferably at least 2.0%. The surface area coverage R2 of the heterogenous phase in the cross section of the inner region 32 is preferably at most 1.3%, and more preferably at most 1.0%.

2. Average Equivalent Circle Diameter S of Heterogenous Phase

The average equivalent circle diameter S1 of the heterogenous phase in the cross section of the surface region 31 is preferably greater than the average equivalent circle diameter S2 of the heterogenous phase in the cross section of the inner region 32. Although there is no particular limitation in relation to the average equivalent circle diameter S1 of the heterogenous phase in the surface region 31, it may be configured to greater than or equal to 0.5 μm and less than or equal to 2.0 μm. Although there is no particular limitation in related to the average equivalent circle diameter S2 of the heterogenous phase in the inner region 32, it may be configured to greater than or equal to 0.1 μm and less than or equal to 1.0 μm.

The equivalent circle diameter of the heterogenous phase is the diameter of a circle that has the same surface area as the cross sectional area of each heterogenous phase in the binarized SEM image. The average equivalent circle diameter S of the heterogenous phase is the arithmetic average value of the equivalent circle diameter of all heterogenous phases observed in a single binarized image (depth direction of 10 μm×a lateral direction of 20 μm).

The number T1 of heterogenous phases in the cross section of the surface region 31 is greater than the number T2 of heterogenous phases in the cross section of the inner region 32. The number T of heterogenous phases is the total number of heterogenous phases observed in a single binarized image (depth direction of 10 μm×a lateral direction of 20 μm).

3. Average Diameter U of PZT Particles

The average diameter U1 of the PZT particles that configure the surface region 31 is smaller than the average diameter U2 of the PZT particles that configure the inner region 32. Although there is no particular limitation in related to the average diameter U1 of the PZT particles that configure the surface region 31, it may be configured to less than or equal to 0.90 μm and preferably less than or equal to 0.85 μm. Although there is no particular limitation in related to the average diameter U2 of the PZT particles that configure the inner region 32, it may be configured to greater than or equal to 0.95 μm and preferably greater than or equal to 1.0 μm.

Figure 6:
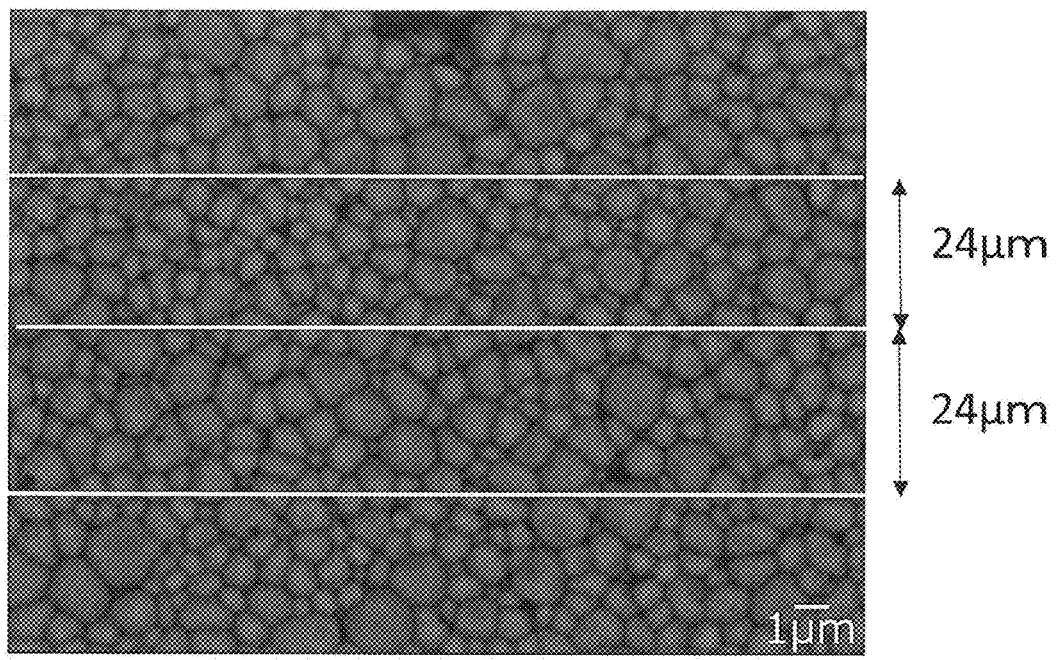
FIG. 6 illustrates an SEM image describing the method of calculating the average particle diameter U of the PZT particles.

FIG. 6 illustrates an SEM image (backscattered electron image) describing the method of calculating the average particle diameter U of the PZT particles. Images are acquired using conditions of an observed range having a depth of 10 μm×a width of 20 μm, an acceleration velocity of 15.0 kV, and an observed magnification of ×5000. Firstly, three straight lines having a width of 24 μm are drawn on the backscattered electron image at an interval of 5 μm. Then, the number of PZT particles falling on each straight line is counted. Next, the particle diameter of the PZT particles on each of the respective three straight lines is calculated by dividing 24 μm by the number of PZT particles on each straight line. The average particle diameter U of the PZT particles is obtained as the arithmetic average (that is to say, divided by 3) of the particle diameters of the PZT particles on the respective three straight lines.

Other Embodiments

The present invention is not limited to the above embodiment, and various changes or modifications may be added within a scope that does not depart from the scope of the invention.

In the above embodiment, the piezoelectric element 1 comprises the first electrode E1 that includes the first inner electrode 5 and the first outer electrode 7, and the second electrode E2 that includes the second inner electrode 15 and the second outer electrode 9. However there is no limitation in this regard. It is sufficient if the piezoelectric element 1 is provided with a pair of electrodes that enable the application of an electrical field to the piezoelectric body 3, and there is no limitation in relation to the related configuration, size, materials, or the like. Therefore the piezoelectric body according to the present invention may be applied to various configurations for a piezoelectric element in addition to the piezoelectric element 1.

In the above embodiment, the surface region 31 is formed on the first side surface 3c of the surface of the piezoelectric body 3. However there is no limitation in this regard, and the surface region 31 may be formed on the whole surface of the surface of the piezoelectric body 3, or may be formed on only a portion of the surface of the piezoelectric body 3. The surface region 31 may be provided at a position at which it is particularly desired to suppress cracks in the piezoelectric body 3.

EXAMPLES

Examples according to the present invention will be described below. However, the present invention is not limited to the examples that are described below.

Preparation of Examples 1 to 3

Figure 7:
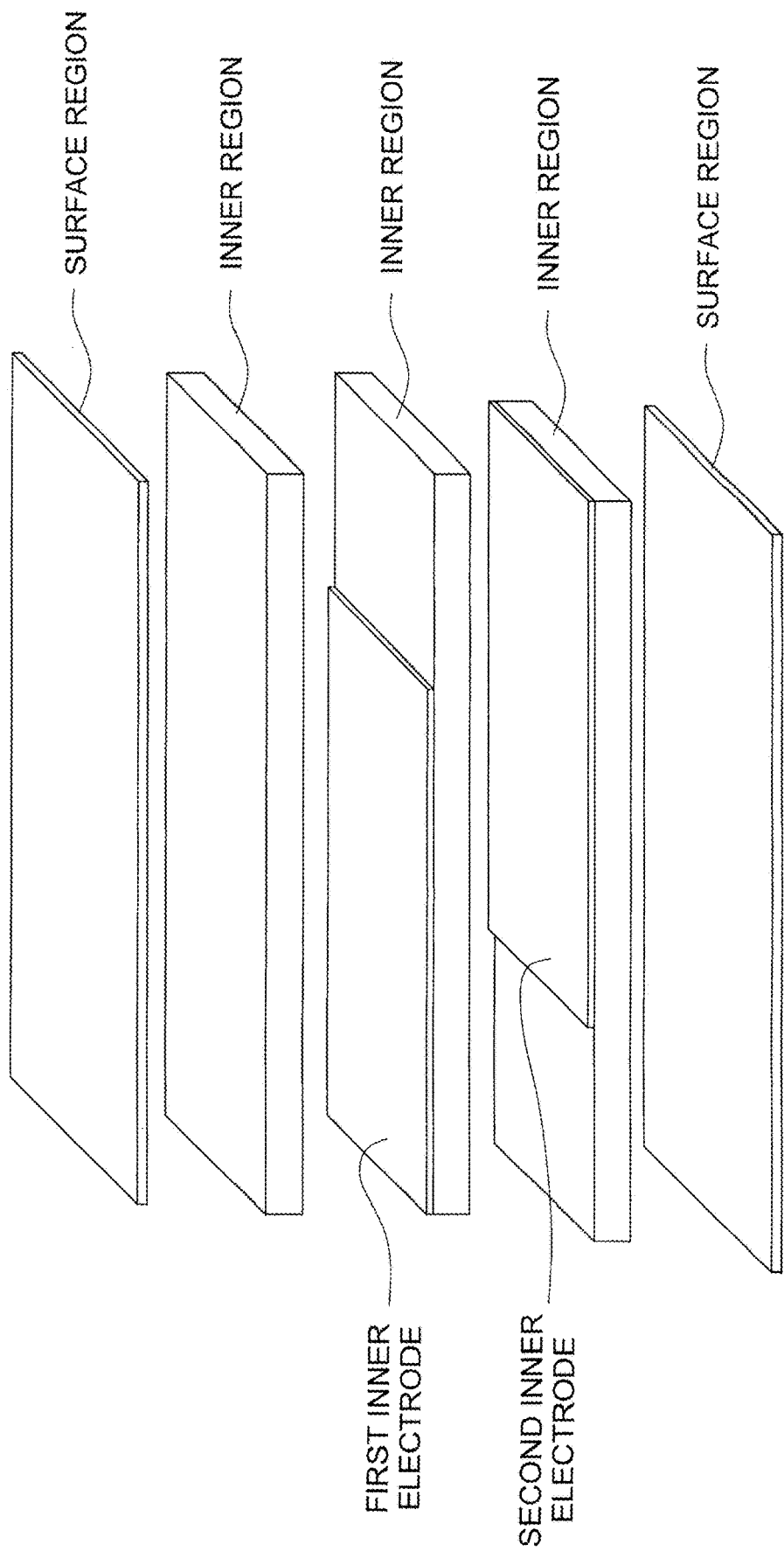
FIG. 7 illustrates the method of manufacturing the piezoelectric element.

FIG. 7 illustrates a method of manufacture of the piezoelectric element according to Examples 1 to 3.

Firstly, two green sheets for use in relation to the surface region are prepared by use of a slurry containing a mixture of 500 g of a PZT powder as a main component, 2 g of $Al_2O_3$ powder as a heterogenous component, a carrying liquid, a dispersion agent and a plasticizing agent.

Next, three green sheets for use in relation to the inner region are prepared by use of a slurry containing a mixture of 500 g of a PZT powder as a main component, a carrying liquid, a dispersion agent and a plasticizing agent. A conductive paste including Pt is coated onto the main surface of one of the green sheets for the inner region to thereby form a green body for a first inner electrode. A conductive paste including Pt is coated onto the main surface of another green sheet for the inner region to thereby form a green body for a second inner electrode. A conductive paste is not coated onto the remaining green sheet for the inner region.

Then as shown in FIG. 7, a stacked body is formed by thermal fusion to sandwich the three green sheets for the inner region by the two green sheets for the surface region. A conductive paste including Pt is coated onto the outer surface of the stacked body to thereby form a green body for the first outer electrode and the second outer electrode (reference is made to FIG. 1).

Next, a piezoelectric element is prepared by firing (1200 degrees C., 2 hours) the stacked body of the green sheets that is provided with a green body for each electrode. The size of the piezoelectric element according to Example 1 is length 1.0 mm×width 0.3 mm×height 0.08 mm.

Preparation of Comparative Examples 1 and 2

Comparative Examples 1 and 2 include the preparation of a piezoelectric element by the same steps as those in Examples 1 to 3 with the exception that $Al_2O_3$ is not mixed as a heterogenous component in the green sheet for the surface region. The size of the piezoelectric element according to Comparative Examples 1 and 2 is the same as the size of the piezoelectric element according to Examples 1 to 3.

Measurement of Heterogenous Phase Surface Area Coverage

Firstly, the piezoelectric elements in Examples 1 to 3 and Comparative Examples 1 to 2 are cut to thereby expose the cross section of the surface region and the inner region.

Then, an SEM that includes a backscattered electron detector (manufactured by JEOL Ltd.) is used under predetermined conditions (observed range: depth direction 10 μm×a lateral direction 20 μm, acceleration velocity:10.0 kV, and observed magnification is ×5000) to acquire a backscattered electron image and a secondary electron image at five positions (five cross sections obtained by equal division into six portions of the piezoelectric body in a longitudinal direction) on a cross section of the surface region (reference is made to FIG. 4).

Next, the backscattered electron image and secondary electron image are compared and the pores on the backscattered electron image are displayed in white (reference is made to FIG. 3). The image processing software PickMap (URL: http://fishers.dtdns.net/software/_pickmap/index.html#1) is used to binarize the backscattered electron image into white and black by use of the average value of RGB as a threshold value to thereby match the SEM image (reference is made to FIG. 5). The total surface area of the black region (heterogenous phase) in the binarized image is calculated using PickMap to thereby acquire the heterogenous phase surface area coverage in the binarized image. The arithmetic average value of the surface area coverage at five positions in the cross section of the surface region is shown in Table 1.

Then, a SEM that includes a backscattered electron detector (manufactured by JEOL Ltd.) is used under predetermined conditions (observed range: depth direction 10 μm×a lateral direction 20 μm, acceleration velocity:10.0 kV, and observed magnification is ×5000) to acquire a backscattered electron image and a secondary electron image at five positions (five cross sections obtained by equal division into six portions of the piezoelectric body in a longitudinal direction) on a cross section of the inner region. Then, the surface area coverage of the heterogenous phase in the inner region is calculated using the same calculation method as that for the surface area coverage of the heterogenous phase in the surface region. The arithmetic average value of the surface area coverage at five positions in the cross section of the surface region is shown in Table 1.

Average Particle Diameter of PZT Particles

Firstly an SEM (manufactured by JEOL Ltd.) is used under predetermined conditions (observed range: depth direction 19 μm×lateral direction 24 μm, acceleration velocity:15.0 kV, and observed magnification ×5000) to acquire a backscattered electron image at one position (in proximity to the surface of the piezoelectric body) on a cross section of the surface region.

Three straight lines having a width of 24 μm are drawn on the backscattered electron image at an interval of 5 μm. Then, the number of PZT particles falling on each straight line is counted. Next, the average particle diameter U of the PZT particles is calculated as the arithmetic average obtained by dividing 24 μm by the number of PZT particles. The average particle diameter of the PZT particles in the surface region is shown in Table 1.

Furthermore, an SEM (manufactured by JEOL Ltd.) is used under predetermined conditions (observed range: depth direction 19 μm×width 24 μm, acceleration velocity: 15.0 kV, and observed magnification ×5000) to acquire a backscattered electron image at one position (another point at a depth of 30 μm from the surface of the piezoelectric body) on a cross section of the inner region. The average particle diameter of the PZT particles in the inner region is obtained using the same method of calculation as that for the average particle diameter of PZT particles in the surface region as described above. The average particle diameter of the PZT particles in the inner region is shown in Table 1.

Measurement of Break Strength

Figure 8:
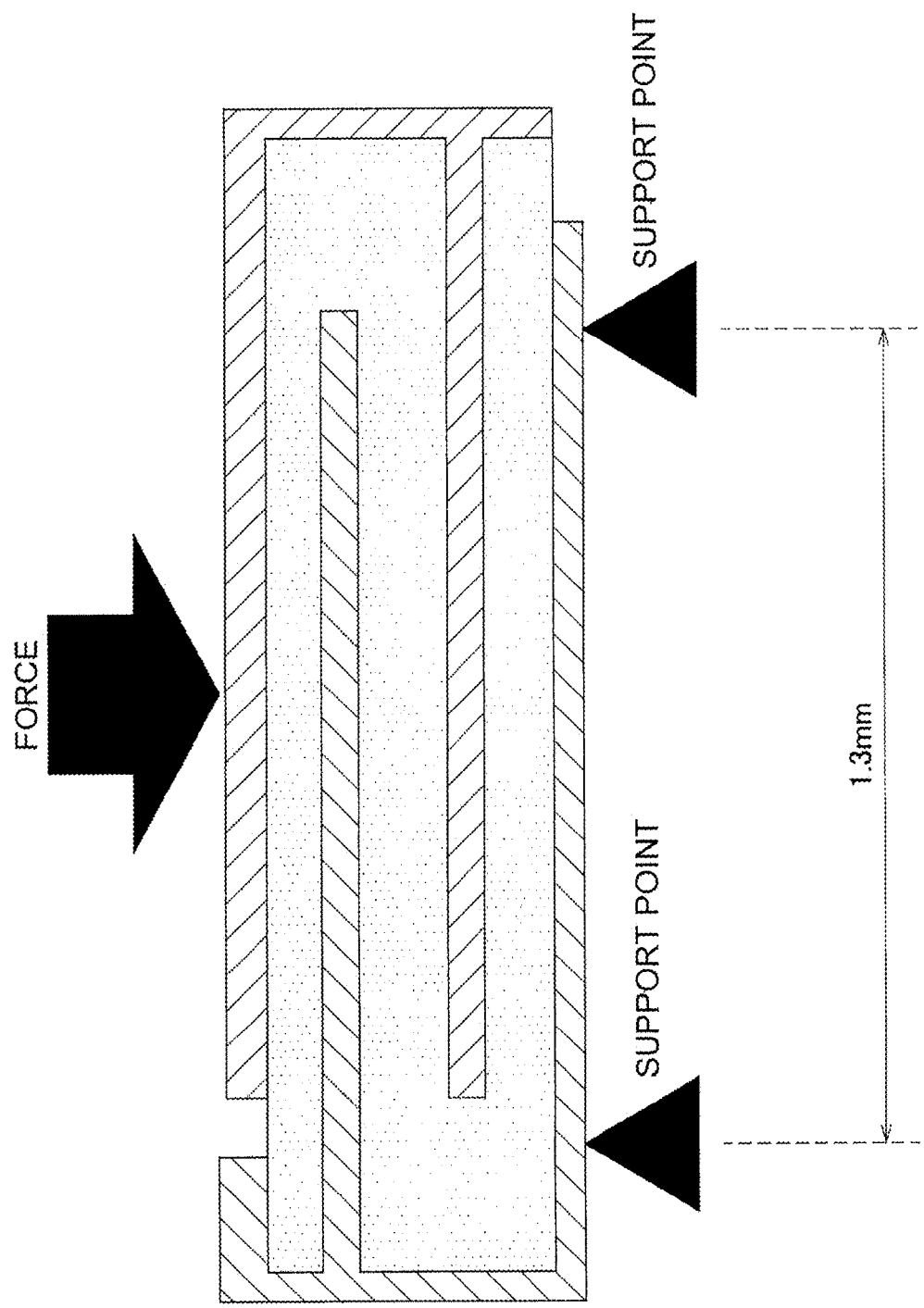
FIG. 8 illustrates a three point bending test method.

As shown in FIG. 8, a three point bending test method is used to measure the break strength of the piezoelectric element according to Examples 1 to 3, and Comparative Examples 1 and 2. The results are shown in Table 1.

TABLE 1

| | Cross Section of Surface Region | | Cross Section of Inner Region | | | |
|---|---|---|---|---|---|---|
| | Surface Area Coverage of Heterogenous Phase | Average Particle Diameter of PZT Particles | Surface Area Coverage of Heterogenous Phase | Average Particle Diameter of PZT Particles | Piezoelectric Constant | Brerak Strength |
| Example 1 | 2.0% | 0.85 μm | 0.8% | 0.95 μm | 150 pm/V | 0.180 N |
| Example 2 | 1.8% | 0.88 μm | 1.0% | 0.95 μm | 150 pm/V | 0.175 N |
| Example 3 | 2.2% | 0.82 μm | 0.7% | 1.00 μm | 150 pm/V | 0.182 N |
| Comparative Example 1 | 1.0% | 0.95 μm | 0.7% | 0.95 μm | 150 pm/V | 0.165 N |
| Comparative Example 2 | 0.8% | 0.95 μm | 2.3% | 0.80 μm | 135 pm/V | 0.185 N |

As shown in Table 1, the break strength of the piezoelectric element is enhanced in Examples 1 to 3 when the surface area coverage of the heterogenous phase in the surface region is at least 0.75 greater than the surface area coverage of the heterogenous phase in the inner region. As a result, even when a mechanical load is applied to the piezoelectric body in the piezoelectric element of Examples 1 to 3, it is possible to suppress the formation of cracks in the surface of the piezoelectric body. This effect is obtained as a result of the fact that particle growth of PZT particles that configure the surface region is suppressed during firing of the piezoelectric body and therefore the average particle diameter of the PZT particles that configure the surface region can be reduced. When Examples 1 to 3 are compared, it is seen that the break strength is enhanced as the average particle diameter of the PZT particles becomes smaller.

In the inner region, particle growth of PZT particles that configure the inner region is not suppressed during firing of the piezoelectric body and therefore the average particle diameter of the PZT particles that configure the inner region increases and thereby enables maintenance of the displacement characteristics of the piezoelectric body.

The invention claimed is:

1. A piezoelectric element comprising;
a piezoelectric body having a lead zirconate titanate main phase and a heterogenous phase that is different from the lead zirconate titanate main phase, and
a pair of electrodes provided on the piezoelectric body,
wherein the piezoelectric body has a surface region within 10 μm of a surface, and an inner region more than 10 μm from the surface,
the surface region and the inner region contain the lead zirconate titanate main phase,
at least the surface region contains the heterogeneous phase, and
a surface area coverage of the heterogenous phase in a cross section of the surface region is at least 0.75% greater than a surface area coverage of the heterogenous phase in a cross section of the inner region.

2. The piezoelectric element according to claim 1, wherein the surface coverage of the heterogenous phase in a cross section of the surface region is greater than or equal to 1.6%, and
the surface coverage of the heterogenous phase in a cross section of the inner region is less than or equal to 1.3%.

3. The piezoelectric element according to claim 1, wherein an average particle diameter of lead zirconate titanate particles of the surface region is smaller than an average particle diameter of lead zirconate titanate particles of the inner region.

4. The piezoelectric element according to claim 3, wherein the average particle diameter of lead zirconate titanate particles of the surface region is less than or equal to 0.90 μm, and
the average particle diameter of lead zirconate titanate particles of the inner region is greater than or equal to 0.95 μm.

5. The piezoelectric element according to claim 1, wherein an average equivalent circle diameter of the heterogenous phase in a cross section of the surface region is greater than an average equivalent circle diameter of the heterogenous phase in a cross section of the inner region.

6. The piezoelectric element according to claim 1, wherein a number of the heterogenous phases in a cross section of the surface region is greater than a number of the heterogenous phases in a cross section of the inner region.

* * * * *